(12) United States Patent
Bazarsky et al.

(10) Patent No.: US 11,894,046 B2
(45) Date of Patent: Feb. 6, 2024

(54) ALIGNMENT OPTIMIZATION OF KEY VALUE PAIR DATA STORAGE

(71) Applicant: Western Digital Technologies, Inc., San Jose, CA (US)

(72) Inventors: Alexander Bazarsky, Holon (IL); David Avraham, Even Yehuda (IL); Ran Zamir, Ramat Gan (IL)

(73) Assignee: Western Digital Technologies, Inc., San Jose, CA (US)

( * ) Notice: Subject to any disclaimer, the term of this patent is extended or adjusted under 35 U.S.C. 154(b) by 127 days.

(21) Appl. No.: 17/746,897

(22) Filed: May 17, 2022

(65) Prior Publication Data
US 2023/0377628 A1  Nov. 23, 2023

(51) Int. Cl.
G11C 11/408 (2006.01)
G11C 11/409 (2006.01)

(52) U.S. Cl.
CPC ........ G11C 11/4085 (2013.01); G11C 11/409 (2013.01)

(58) Field of Classification Search
CPC .......................... G11C 11/4085; G11C 11/408
USPC ....................................................... 365/222
See application file for complete search history.

(56) References Cited

U.S. PATENT DOCUMENTS

| | | | | |
|---|---|---|---|---|
| 11,210,166 B1* | 12/2021 | Twitto | ............... | G11C 16/349 |
| 2016/0124848 A1* | 5/2016 | Bellorado | ........... | G06F 12/0246 |
| | | | | 711/103 |
| 2017/0364280 A1 | 12/2017 | Kim | | |
| 2018/0165022 A1* | 6/2018 | Tomic | ............... | G06F 11/1004 |
| 2018/0253449 A1 | 9/2018 | Feldman et al. | | |
| 2019/0012085 A1 | 1/2019 | Schreter | | |
| 2019/0087437 A1 | 3/2019 | Zayas et al. | | |
| 2019/0138612 A1 | 5/2019 | Jeon et al. | | |

OTHER PUBLICATIONS

Kim et al., The Key to Value: Understanding the NVMe Key-Value Standard, Live Website, Sep. 1, 2020, SNIA SF, Networking Storage, 31 pp.*
Adams, NVMe® Base Specification 2.0 Preview, Flash Memory Summit, 2020, NVM Express organization, 20 pp.*
Samsung Key Value SSD Enables High Performace Scaling, A TEchnology Brief by Samsung Memory Solutions Lab Samsung Electronics, Co. Ltd., 2018, 8 pp.*

(Continued)

*Primary Examiner* — Muna A Techane
(74) *Attorney, Agent, or Firm* — PATTERSON + SHERIDAN, LLP; Steven H. VerSteeg (57) ABSTRACT

A data storage device includes a memory device and a controller coupled to the memory device. The controller is further configured to receive a key value (KV) pair data, determine a size of a value length and a size of a target wordline of the memory device for programming of the KV pair data, determine a size of residual data, store the residual data in a location separate from the target wordline and the KV pair data minus the residual data to the target wordline, and read the residual data from the location separate and the target wordline data in response to a read command for the KV pair data. The size of the value length is greater than the size of the target wordline. The size of the residual data is the size of the value length minus the size of the target wordline.

20 Claims, 7 Drawing Sheets

(56) References Cited

OTHER PUBLICATIONS

Martin et al., NVM Express Technical Propsal for new Feature, Jun. 2020, NVM Express, Inc., 34 pp.*

Kim, et al., The Key to Value: Understanding the NVMe Key-Value Standard, Live Website, Sep. 1, 2020, SNIA NSF, Networking Storage, 31 pp.

Samsung Key Value SSD Enables High Performance Scaling, A Technology Brief by Samsung Memory Solutions Lab, Samsung Electronics, Co. Ltd., 2017, 8 pp.

Martin, et al., NVM Express Technical Proposal for New Feature, Jun. 2020, NVM Express, Inc., 34 pp.

\* cited by examiner

ALIGNMENT OPTIMIZATION OF KEY VALUE PAIR DATA STORAGE

BACKGROUND OF THE DISCLOSURE

Field of the Disclosure

Embodiments of the present disclosure generally relate to data storage devices, such as solid state drives (SSDs), and, more specifically, optimizing storage of key value (KV) pair data in a data storage device.

Description of the Related Art

A KV database works by storing a quantity of user data that is associated with a key that is addressable as a complete entity. Examples of user data that can be stored in a KV database may include photos, records, and files. From a host device point-of-view, the photo, the record, or the file may be retrieved using a single key/address, rather than using multiple addresses that include data of the photo, the record, or the file. The data is stored as unstructured data and may be addressed using a key of variable length. Storage space of a memory device may be allocated for KV pair data in increments of bytes, where a length value of the KV pair data is associated with the necessary storage space to store the KV pair data.

Using a KV database in a data storage device may increase the performance of the data storage device. For example, the number of data transfers/second may be improved because the KV pair data to physical storage location translation layer in the host device may be removed. Furthermore, the number of commands over the bus may be reduced since an entire KV pair data may utilize a single transfer. KV pair data allows access to data on a controller using a key rather than a block address.

By providing a key to store a corresponding value on a memory device, the value may be retrieved from the memory device using the corresponding key. Because the value may be a variable length, the size of the value may not align with a physical memory boundary. For example, the value may be stored across multiple wordlines. Because data may be stored sequentially in the memory device, another value may exist in the same wordline as the value. Thus, the data of the value and the another value may be misaligned and reading the misaligned data may require additional bandwidth, resources, and time, which may impact data storage device performance.

Therefore, there is a need in the art for an improved storage of KV pair data.

SUMMARY OF THE DISCLOSURE

The present disclosure generally relates to data storage devices, such as solid state drives (SSDs), and, more specifically, optimizing storage of key value (KV) pair data in a data storage device. A data storage device includes a memory device and a controller coupled to the memory device. The controller is further configured to receive a key value (KV) pair data, determine a size of a value length and a size of a target wordline of the memory device for programming of the KV pair data, determine a size of residual data, store the residual data in a location separate from the target wordline and the KV pair data minus the residual data to the target wordline, and read the residual data from the location separate and the target wordline data in response to a read command for the KV pair data. The size of the value length is greater than the size of the target wordline. The size of the residual data is the size of the value length minus the size of the target wordline.

In one embodiment, a data storage device includes a memory device and a controller coupled to the memory device. The controller is further configured to receive a key value (KV) pair data, where the KV pair data includes a key and a value, and where the value has a value length, determine a size of the value length and a size of a target wordline of the memory device for programming of the KV pair data, where the size of the value length is greater than the size of the target wordline, determine a size of residual data, where the size of the residual data is the size of the value length minus the size of the target wordline, and store the residual data in a location separate from the target wordline and the KV pair data minus the residual data to the target wordline.

In another embodiment, a data storage device includes a memory device and a controller coupled to the memory device. The controller is further configured to receive a read command to read key value (KV) pair data, where the KV pair data includes a key and a value, determine if an aggregate wordline exists in the data storage device, where the aggregate wordline stores residual data of one or more KV pair data that exceeds a size of a wordline, and where the aggregate wordline includes residual data corresponding to the KV pair data, determine that the aggregate wordline exists in a first memory location of the memory device, read the KV pair data from a second memory location of the memory device based on the determining, where the first memory location and the second memory location are different memory types, and provide the residual data corresponding to the KV pair data from the first memory location and the KV pair data from the second memory location.

In another embodiment, a data storage device includes memory means and a controller coupled to the memory means. The controller includes an analysis and aggregation module. The analysis and aggregation module is configured to determine a length of a received key value (KV) pair data, where the length is greater than a size of a target wordline for programming of the received KV pair data, and determine a maximum number of values to store in an aggregate wordline, where the aggregate wordline stores residual data of one or more KV pair data, and where the residual data corresponds to data of the one or more KV pair data that exceeds the size of the target wordline. The controller is configured to aggregate the residual data of the one or more KV pair data to the aggregate wordline and program the aggregate wordline to the memory means.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, such as solid state drives (SSDs), and, more specifically, optimizing storage of key value (KV) pair data in a data storage device. A data storage device includes a memory device and a controller coupled to the memory device. The controller is further configured to receive a key value (KV) pair data, determine a size of a value length and a size of a target wordline of the memory device for programming of the KV pair data, determine a size of residual data, store the residual data in a location separate from the target wordline and the KV pair data minus the residual data to the target wordline, and read the residual data from the location separate and the target wordline data in response to a read command for the KV pair data. The size of the value length is greater than the size of the target wordline. The size of the residual data is the size of the value length minus the size of the target wordline.

Figure 1:
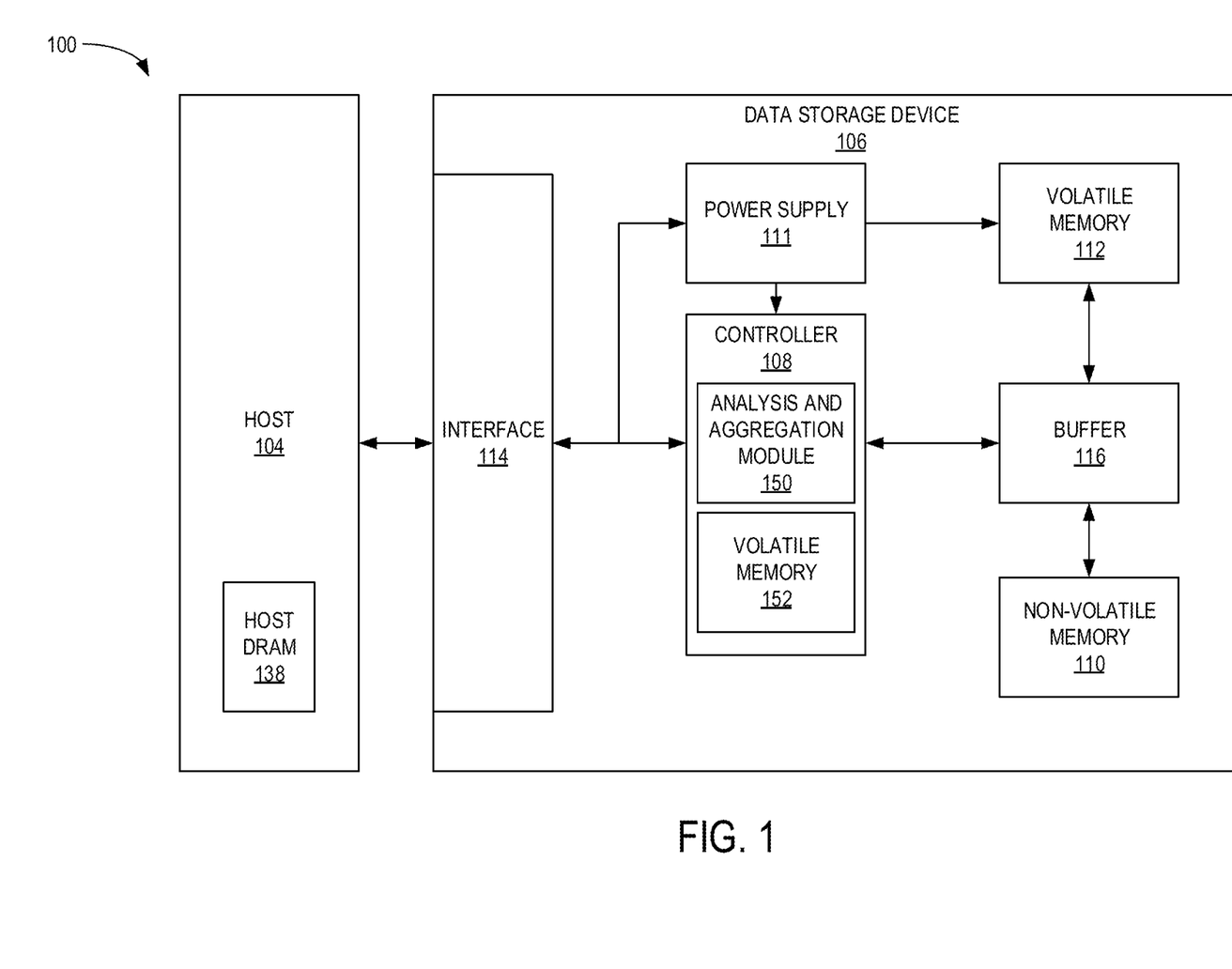
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory, such as a second volatile memory 152, or write buffer 116 before sending the data to the NVM 110.

The controller 108 includes an analysis and aggregation module 150 and the second volatile memory 152. The second volatile memory 152 may be SRAM. The controller 108 may utilize the second volatile memory 152 as a temporary holding location within the controller 108. Because data may be programmed to the NVM 110 sequentially, or, more specifically, wordline by wordline, the controller 108 may use the second volatile memory 152 as a cache to store data based on an expected condition of a health of the block having the wordlines to be programmed to. For example, conditions relating to the health of the block may include, but not limited to, a number of program erase cycles (PEC), a bit error rate (BER) severity, a physical location of a wordline on the block, and an amount of time exceeding a temperature threshold or thresholds. Wordlines near an edge of the block may exhibit higher BER than wordlines near the middle of the block.

The analysis and aggregation module 150 may be configured to determine a length of KV pair data received from the host device 104 or fetched from the host device 104. The analysis and aggregation module 150 may be further configured to determine a maximum number of values that may be stored in an aggregation wordline of the second volatile memory 152, where the aggregation wordline of the second volatile memory is programmed to the NVM 110 when the aggregation wordline is filled or as part of a partial page programming operation. Thus, the controller 108 may store a portion of a value of the KV pair data in the second volatile memory 152 based on the determination of the analysis and aggregation module 150. Furthermore, the determining may be a dynamic determining, such that the number of values that may be stored in the aggregation wordline is updated each time a portion of the value of the KV pair data is stored in the aggregation wordline.

Figure 2A:
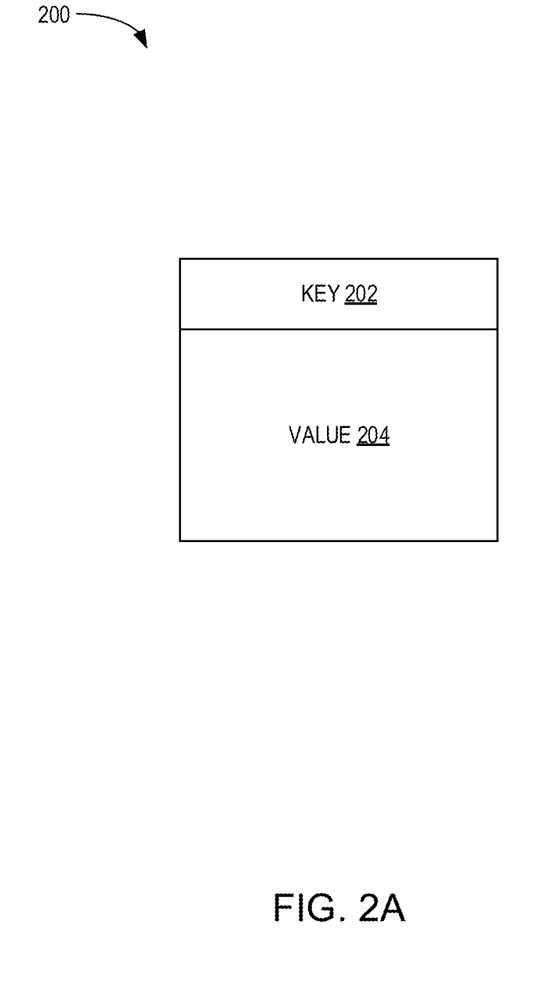
FIG. 2A is an exemplary illustration of a KV pair data, according to certain embodiments.

FIG. 2A is an exemplary illustration of a KV pair data 200, according to certain embodiments. KV pair data 200 includes a key 202 and a value 204, where the data, which may be host data, of the value 204 is addressed by the key 202. The key 202 may have a size of about 1 byte to about 64 bytes and the value 204 may have a size of about 0 bytes to about $2^{32}-1$ bytes. For example, when the value 204 has a size of about 0 bytes, the value 204 is an empty value. It is to be understood that the previously mentioned values are not intended to be limiting, but to provide an example of an embodiment. Because the value 204 may have a size greater than a physical wordline (e.g., greater than 16 KB), the value 204 may be divided across several wordlines and may result in misalignment. Misalignment may occur when partial data from multiple values are stored in a single wordline or when a portion of the value 204 is stored partially on a single wordline. Because misalignment of stored data may result in multiple reads, quality of service of a data storage device storing the misaligned data may be decreased and power consumption of the data storage device may be increased.

Figure 2B:
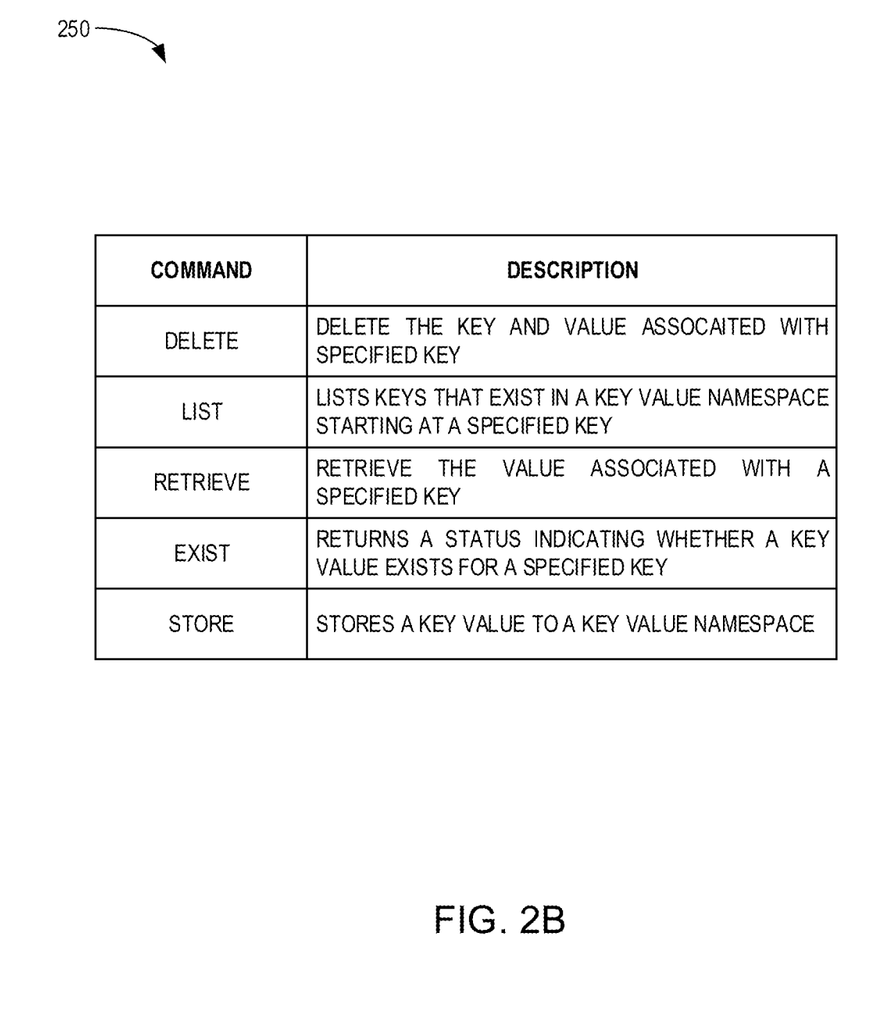
FIG. 2B is a table illustrating a command set for a KV database, according to certain embodiments.

FIG. 2B is a table 250 illustrating a command set for a KV database, according to certain embodiments. For exemplary purposes, aspects of the storage system 100 of FIG. 1 may be referenced herein. A KV system may include a command set that includes, in a non-limiting list, a delete command, a list command, a retrieve command, an exist command, and a store command. The delete command may cause the controller 108 to delete the key 202 and value 204 associated with the key 202. The list command may cause the controller 108 to list keys that exist in a KV namespace starting at a specified key. The exist command may cause the controller 108 to return a status indicating whether a KV pair data 200 exists for a specified key to the command generator, such as the host device 104. The store command may cause the controller 108 to store a KV pair data to a KV namespace.

The retrieve command may cause the controller 108 to retrieve the value 204 associated with a specified key from a KV namespace. The length to be retrieved of the KV pair data 200 is specified in the retrieve command and the location to transfer the KV pair data 200 is specified by either a scatter gather list (SGL) pointer or a physical region page (PRP) pointer in the retrieve command. If the specified length in the retrieve command is less than the length of the KV pair data 200 that is being retrieved, then the controller 108 returns the requested amount and the length of the KV pair data 200 to the completion queue. However, if the specified length in the retrieve command is greater than the length of the KV pair data 200 that is being retrieved, then the controller 108 returns the data from the NVM 110 and the length of the KV pair data 200 is returned to the completion queue.

Figure 3:
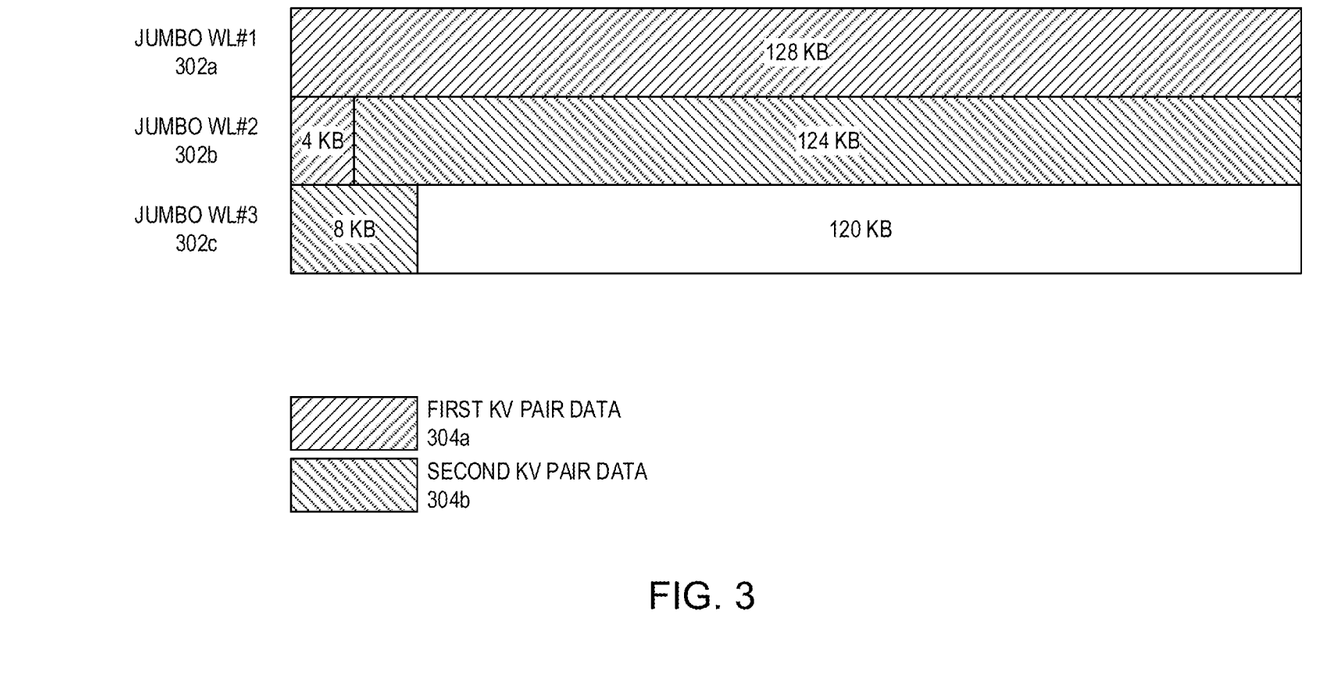
FIG. 3 is an exemplary illustration of a problematic alignment of a first value of a first KV pair data and a second value of a second KV pair data, according to certain embodiments.

FIG. 3 is an exemplary illustration of a problematic alignment of a first value of a first KV pair data 304a and a second value of a second KV pair data 304b, according to certain embodiments. FIG. 3 shows a first jumbo wordline 302a, a second jumbo wordline 302b, and a third jumbo wordline 302c. It is to be understood that the number of jumbo wordlines shown is not to be limiting. A jumbo wordline may be a wordline selected from each plane of a plurality of dies. For example, if a wordline size is 16 KB, then the number of planes that a wordline is selected from is 8. Therefore, a jumbo wordline may span across 4 dies, where each die has 2 planes. Furthermore, the wordline selected on each of the planes may be the same wordline. For example, for each of the planes used, the first wordline may be used to from the first jumbo wordline 302a.

The first KV pair data 304a and the second KV pair data 304b are both greater than 128 KB. The first KV pair data 304a includes a value having a value length of 132 KB and the second KV pair data 304b includes a value having a value length of 132 KB. Because the value length of the first KV pair data 304a is greater than a size of the jumbo wordline, a remaining portion of the first KV pair data 304a that is not programmed to the first jumbo wordline 302a due to the first jumbo wordline 302a reaching a programming capacity is programmed to the second jumbo wordline 302b. The second KV pair data 304b is programmed to the remaining capacity of the second jumbo wordline 302b. However, not all of the second KV pair data 304b is able to be programmed to the second jumbo wordline 302b. Therefore, a remaining portion of the second KV pair data 304b that is not programmed to the second jumbo wordline 302b is programmed to the third jumbo wordline 302c.

When a controller, such as the controller 108 of FIG. 1, receives a first read command for the first KV pair data 304a, the controller 108 reads both the first jumbo wordline 302a and the second jumbo wordline 302b. When the controller 108 receives a second read command for the second KV pair data 304b, the controller 108 reads the second jumbo wordline 302b and the third jumbo wordline 302c. Thus, the second jumbo wordline 302b is read twice in order to provide the first KV pair data and the second KV pair data to the requester (e.g., a host device, such as the host device 104 of FIG. 1, sending the first read command and the second read command).

Figure 4:
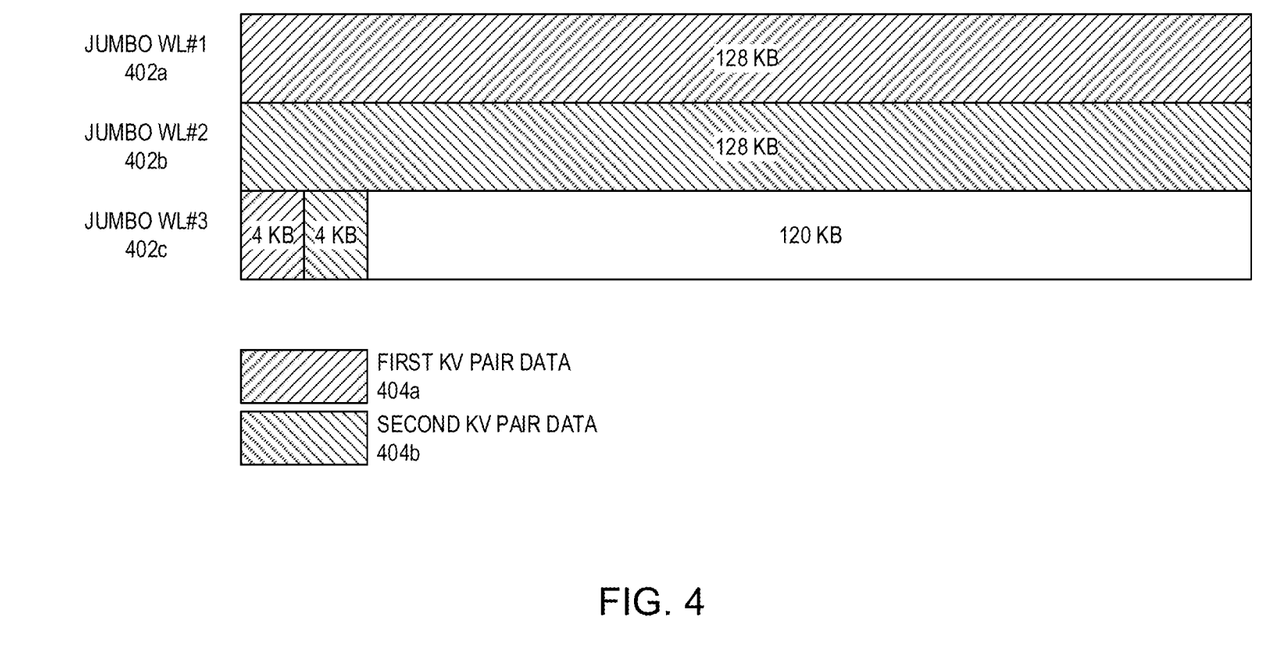
FIG. 4 is an exemplary illustration of an optimized alignment of a first value of a first KV pair data and a second value of a second KV pair data, according to certain embodiments.

FIG. 4 is an exemplary illustration of an optimized alignment of a first value of a first KV pair data 404a and a second value of a second KV pair data 404b, according to certain embodiments. FIG. 4 shows a first jumbo wordline 402a, a second jumbo wordline 402b, and a third jumbo wordline 402c. It is to be understood that the number of jumbo wordlines shown is not to be limiting. A jumbo wordline may be a wordline selected from each plane of a plurality of dies. For example, if a wordline size is 16 KB, then the number of planes that a wordline is selected from is 8. Therefore, a jumbo wordline may span across 4 dies, where each die has 2 planes. Furthermore, the wordline selected on each of the planes may be the same wordline. For example, for each of the planes used, the first wordline may be used to from the first jumbo wordline 402a.

The first KV pair data 404a and the second KV pair data 404b are both greater than 128 KB. The first KV pair data 404a includes a value having a value length of 132 KB and the second KV pair data 404b includes a value having a value length of 132 KB. Because the value length of the first KV pair data 404a is greater than a size of the jumbo wordline, a remaining portion of the first KV pair data 404a that is not programmed to the first jumbo wordline 402a due to the first jumbo wordline 402a reaching a programming capacity is programmed to the third jumbo wordline 402c. The second KV pair data 404b is programmed to the second jumbo wordline 402b. Because the value length of the second KV pair data 404b is greater than a size of the jumbo wordline, a remaining portion of the second KV pair data 404b that is not programmed to the second jumbo wordline 402b due to the second jumbo wordline 402b reaching a programming capacity is programmed to the third jumbo wordline 402c. Therefore, the third jumbo wordline 402c may be an aggregate wordline storing one or more overflow KV pair data.

When a controller, such as the controller 108 of FIG. 1, receives a first read command for the first KV pair data 404a, the controller 108 reads both the first jumbo wordline 402a and the third jumbo wordline 402c, where the third jumbo wordline 402c is an aggregate wordline. Because the third jumbo wordline 402c includes data of more than one KV pair data, the controller 108 may store the data corresponding to the read of the third jumbo wordline 402c to an internal cache of the controller 108, such as the second volatile memory 152. In some examples, the controller 108 may store the data corresponding to the read of the third jumbo wordline 402c to a volatile memory external to the controller 108, such as the volatile memory 112 of FIG. 1, which may be DRAM memory.

When the controller 108 receives a second read command for the second KV pair data 404b, the controller 108 reads the second jumbo wordline 402b and retrieves the relevant data corresponding to the second KV pair data 404b from the internal cache of the controller 108. Because the data corresponding to the portion of the second KV pair data 404b that is not stored in the second jumbo wordline 402b is stored in the second volatile memory 152 of the controller 108, the relevant data corresponding to the portion of the second KV pair data 404b may be provided to the sender of the second read command. Reading from the second volatile memory 152 may be quicker than reading the remaining portion of the second KV pair data 404b from the NVM 110, where the second KV pair data 404b is stored. Furthermore, because multiple KV pair data may be stored in the aggregate wordline, the aggregate wordline may be read more than other programmed wordlines. By keeping the aggregate wordline in the volatile memory after a first read, the aggregate wordline may be accessed more efficiently.

Figure 5:
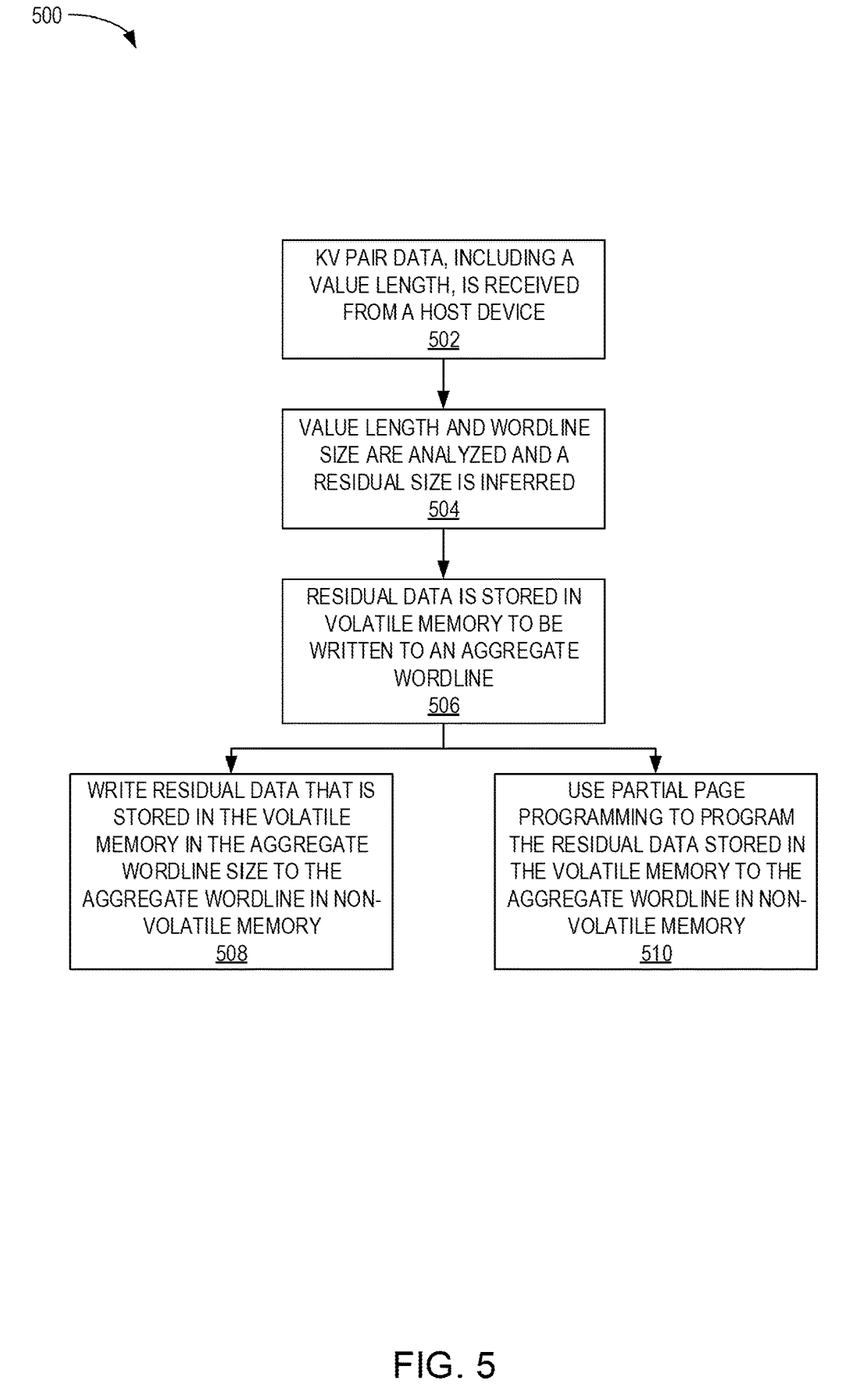
FIG. 5 is a flow diagram illustrating a method of writing KV pair data to a memory device having an optimized alignment, according to certain embodiments.

FIG. 5 is a flow diagram illustrating a method 500 of writing KV pair data, such as the KV pair data 200 of FIG. 2, to a memory device, such as the NVM 110 of FIG. 1, having an optimized alignment, according to certain embodiments. Method 500 may be implemented by a controller, such as the controller 108 of FIG. 1. For exemplary purposes, aspects of the storage system 100 of FIG. 1 may be referenced herein.

At block 502, KV pair data, including a value length is received from the host device 104. At block 504, the value length and a wordline size are analyzed and a residual size of the received KV pair data is inferred. The analyzing and the inferring may be completed by the analysis and aggregation module 150. Furthermore, the wordline may be a jumbo wordline, as described in FIGS. 3 and 4. At block 506, residual data of the KV pair data (i.e., the portion of the KV pair data that is greater than a first wordline, but less than a second wordline) is stored in a volatile memory in order to be written an aggregate wordline of the NVM 110. The volatile memory may be the second volatile memory 152 of the controller 108.

Method 500 continues to either block 508 or block 510. At block 508, the one or more residual data that is stored in the second volatile memory 152 to be written to the aggregate wordline is written to the aggregate wordline of the NVM 110. The writing may occur when the one or more residual data that is stored in the second volatile memory 152 reaches a threshold size. For example, the threshold size may be equal to a size of the wordline of the NVM 110. At block 510, the controller 108 utilizes partial page programming to program the residual data stored in the second volatile memory 152 to the aggregate wordline in the NVM 110. The partial page programming may be utilized when the one or more residual data is less than a wordline size, but needs to be committed to the NVM 110. For example, when the data storage device 106 experiences a power loss event, the data stored in the second volatile memory 152 may be flushed to the NVM 110 as part of a data saving event. Furthermore, the controller 108 may use partial page programming to program the one or more residual data from the second volatile memory 152 to the NVM 110 after a threshold period of time has passed since the first residual data has been stored in the volatile memory.

Figure 6:
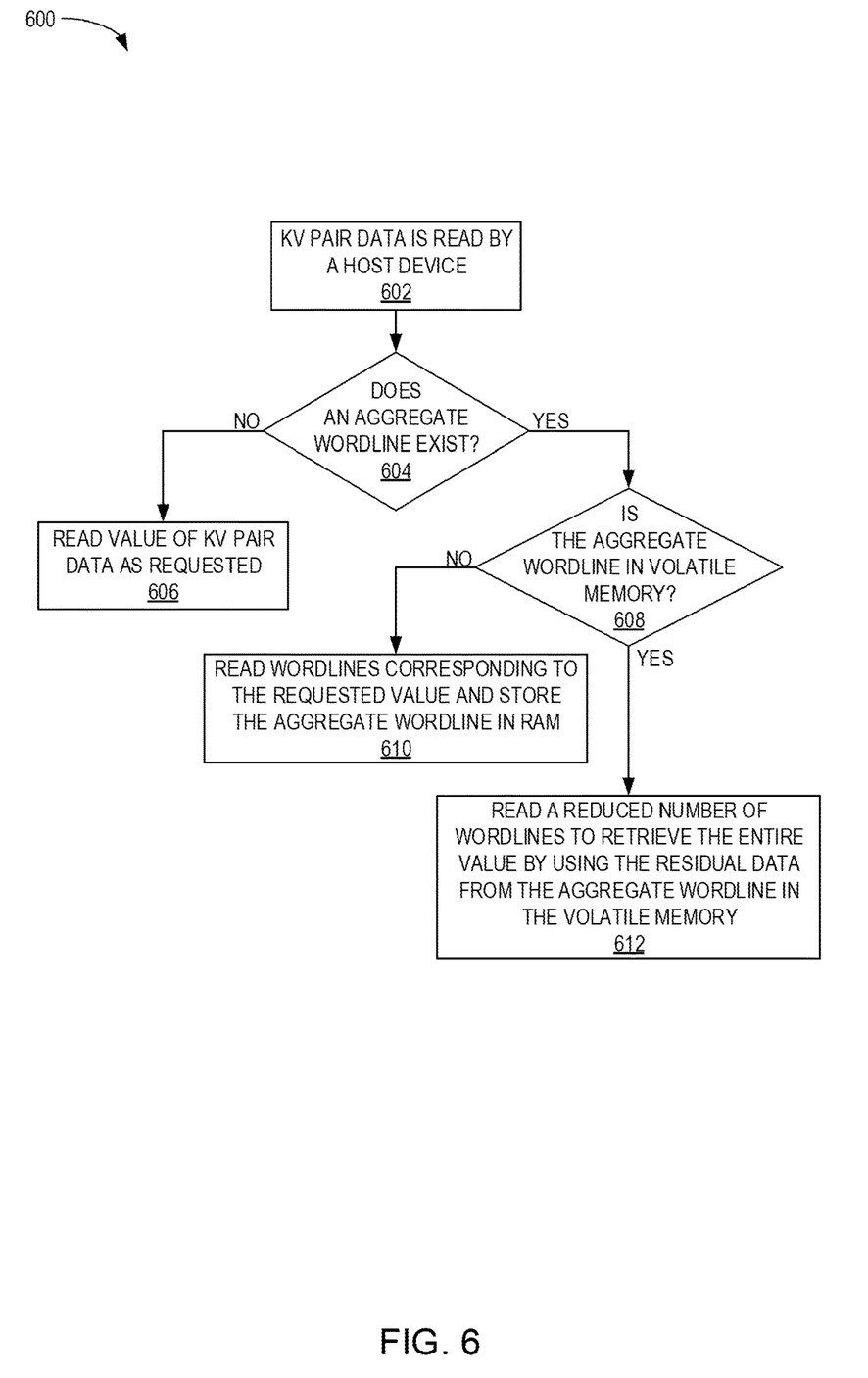
FIG. 6 is a flow diagram illustrating a method of reading KV pair data from a memory device having an optimized alignment, according to certain embodiments.

FIG. 6 is a flow diagram illustrating a method 600 of reading KV pair data, such as the KV pair data 200 of FIG. 2, from a memory device, such as the NVM 110 of FIG. 1, having an optimized alignment, according to certain embodiments. Method 600 may be implemented by a controller, such as the controller 108 of FIG. 1. For exemplary purposes, aspects of the storage system 100 of FIG. 1 may be referenced herein.

At block 602, the controller 108 receives a read command to read KV pair data from the NVM 110. At block 604, the controller 108 determines if an aggregate wordline exists in the data storage device 106. For example, the analysis and aggregation module 150 may be further configured to check whether the sizes of the value lengths of the KV pair data stored in the data storage device and the sizes of the physical wordlines may indicate that an aggregate wordline exists in the data storage device 106. It is to be understood that one or more aggregate wordlines may exist in the data storage device 106, where each of the one or more aggregate wordlines may correspond to different logical block address (LBA) ranges or physical block address (PBA) ranges. If there is not an aggregate wordline in the data storage device 106 at block 604, then the controller 108 reads the value of the KV pair data as requested at block 606. However, if an aggregate wordline exists in the data storage device 106 at block 604, then the controller 108 determines if the aggregate wordline corresponding to the requested KV pair data is stored in volatile memory, such as the second volatile memory 152, at block 608.

If there is not an aggregate wordline stored in the second volatile memory 152 corresponding to the requested KV pair data at block 608, then the controller 108 reads the wordlines corresponding to the requested value corresponding to the KV pair data of the read command and stores the aggregate wordline to the second volatile memory 152 at block 610. However, if there is an aggregate wordline stored in the second volatile memory 152 corresponding to the requested KV pair data at block 608, then the controller 108 reads a reduced number of wordlines to retrieve the entire value of the requested KV pair data by reading the wordlines corresponding to the KV pair data, ignoring the aggregate wordline stored in the NVM, and reading the aggregate wordline stored in the volatile memory 112 at block 612.

Figure 7:
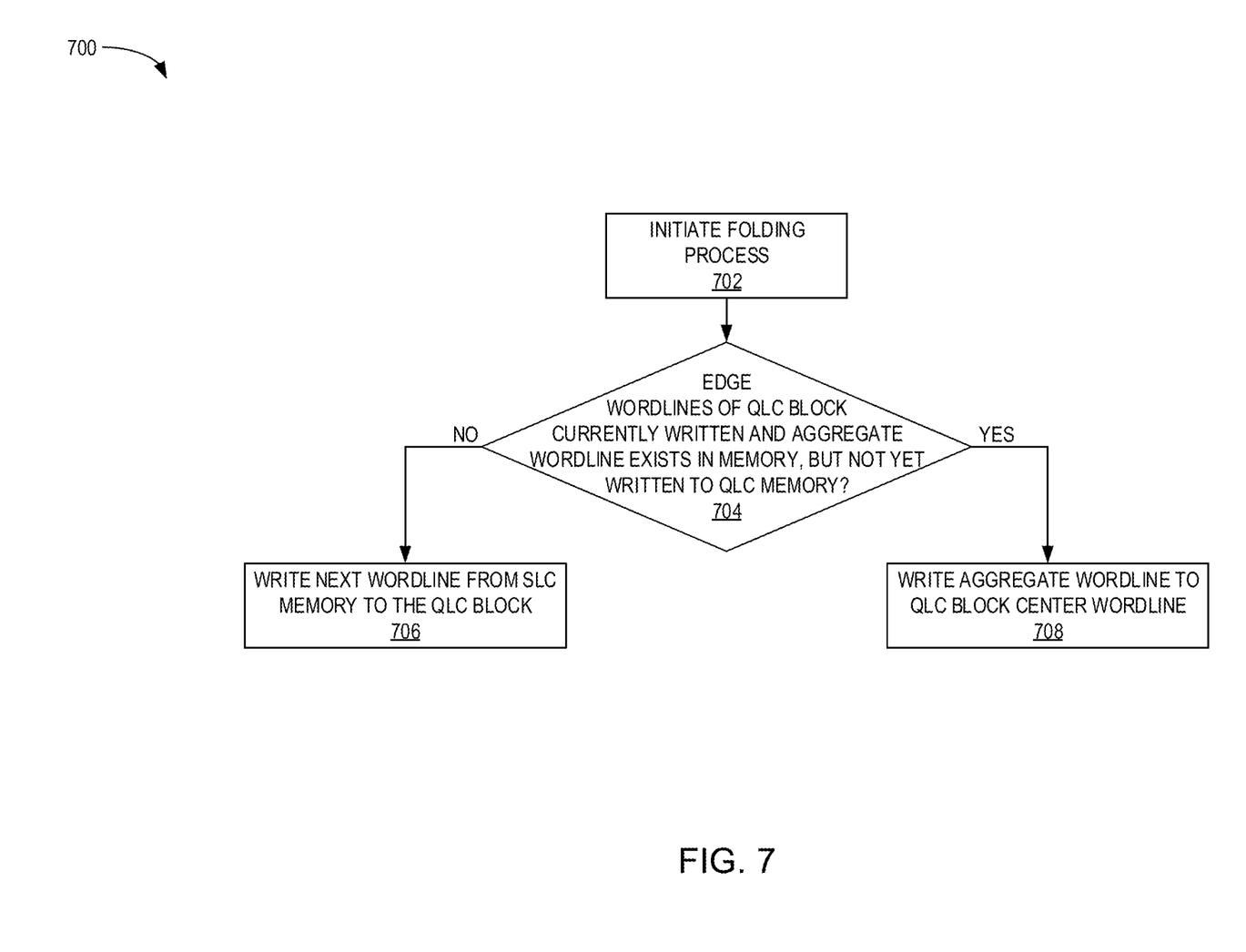
FIG. 7 is a flow diagram illustrating a method of SLC memory to QLC memory folding for KV pair data having an optimized alignment, according to certain embodiments.

FIG. 7 is a flow diagram illustrating a method 700 of SLC memory to QLC memory folding for KV pair data, such as the KV pair data 200 of FIG. 2, having an optimized alignment, according to certain embodiments. Method 700 may be implemented by a controller, such as the controller 108 of FIG. 1. For exemplary purposes, aspects of the storage system 100 of FIG. 1 may be referenced herein. Because each read of a wordline may degrade a quality of the cells of the wordline read and the adjacent wordlines of the wordline read, method 700 may be used to mitigate the adverse effects of read disturb events. An aggregate wordline stored in the NVM 110 may be read or accessed a greater number of times than a wordline not storing more than one KV pair data values. Thus, the aggregate wordline stored in the NVM 110 and adjacent wordlines to the aggregate wordline may experience an elevated bit error rate, which may decrease quality of service of the data storage device 106.

At block 702, the controller 108 initiates a folding process. The folding process may include programming KV pair data stored in SLC memory into TLC memory or QLC memory. Because the read order from the SLC memory is not limited, the aggregate wordline stored in the SLC memory may be written to the TLC memory or the QLC memory in a non-consecutive manner. For example, referring to FIG. 4, if the first jumbo wordline 402a, the second jumbo wordline 402b, and the third jumbo wordline 402c are stored in SLC memory, the third jumbo wordline may be programmed to TLC memory or QLC memory after programming either the first jumbo wordline 402a or the second jumbo wordline 402b to TLC memory or QLC memory or before programming the first jumbo wordline 402a to TLC memory or QLC memory.

At block 704, the controller 108 determines if both an edge wordline of the QLC block (or TLC block) is currently written to (or the center wordlines of the QLC block or TLC block are currently being written to) and an aggregate wordline exists in memory, but not yet written to QLC memory (or TLC memory) (i.e., stored in volatile memory). It is to be understood that reference to an edge wordline may refer to one or more wordlines that are closer to an edge boundary of the block than a center of the block. In QLC memory, a center wordline may be wordline 24 and wordline 76 or wordlines close to wordline 24 and wordline 76. In other words, a center wordline may be a wordline as far as possible from a boundary or edge wordline, such as wordline 0, wordline 49, and wordline 95. If both an edge wordline of the QLC block (or TLC block) is not currently written to (or the center wordlines of the QLC block or TLC block is not currently being written to) and the aggregate wordline does not exist in memory (or exists and is written to QLC memory) at block 704, then the controller 108 writes a next wordline (that is not the aggregate wordline) from SLC memory to the QLC block (or the TLC block) at block 706. However, if both an edge wordline of the QLC block (or TLC block) is currently written to (or the center wordlines of the QLC block or TLC block are currently being written to) and the aggregate wordline exists in memory, but not yet written to QLC memory (or TLC memory) at block 704, then the controller 108 writes the aggregate wordline to the center wordline of a QLC block (or TLC block) at block 708.

By storing overflow KV pair data in an aggregate wordline, the quality of service of random value read workloads of KV pair data storage may be improved, which may reduce read latency and power consumption of the data storage device.

In one embodiment, a data storage device includes a memory device and a controller coupled to the memory device. The controller is further configured to receive a key value (KV) pair data, where the KV pair data includes a key and a value, and where the value has a value length, determine a size of the value length and a size of a target wordline of the memory device for programming of the KV pair data, where the size of the value length is greater than the size of the target wordline, determine a size of residual data, where the size of the residual data is the size of the value length minus the size of the target wordline, and store the residual data in a location separate from the target wordline and the KV pair data minus the residual data to the target wordline.

The location separate from the target wordline is volatile memory. The controller is further configured to aggregate two or more residual data in the location separate from the target wordline. The controller is further configured to program the aggregated two or more residual data to an aggregate wordline of the memory device when a size of the aggregated two or more residual data reaches or exceeds a size of the aggregate wordline. The controller is further configured to, when the aggregated two or more residual data exceeds the size of the aggregate wordline, store a remaining residual of the aggregated two or more residual data in the location separate from the target wordline. The remaining residual is a portion of the aggregated two or more residual data that exceeds the size of the aggregate wordline. The controller is further configured to program the stored residual data to an aggregate wordline of the memory device when a predetermined period of time has elapsed. The controller is further configured to receive another KV pair data, where the another KV pair data has a size greater than another target wordline, determine a size of an another value length associated with the another KV pair data and a size of the another target wordline of the memory device for programming of the KV pair data, determine a size of another residual data, where the size of the another residual data is the size of the another value length minus the size of the another target wordline, and store the another residual data in the location separate from the target wordline and the another KV pair data minus the another residual data in the another target wordline. The controller is further configured to receive a read command for the another KV pair data, read the another target wordline and the location separate from the target wordline, where both the another residual data and the residual data are read, and provide the another KV pair data minus the another residual data from the another target wordline and the another residual data from the location separate from the target wordline. The controller is further configured to receive another read command for the KV pair data, read the target wordline, and provide the KV pair data minus the residual data from the target wordline and the residual data previously read. The controller is further configured to program the residual data stored in the location separate from the target wordline to an aggregate wordline of the memory device. The aggregate wordline is disposed closer to a center wordline than an edge wordline.

In another embodiment, a data storage device includes a memory device and a controller coupled to the memory device. The controller is further configured to receive a read command to read key value (KV) pair data, where the KV pair data includes a key and a value, determine if an aggregate wordline exists in the data storage device, where the aggregate wordline stores residual data of one or more KV pair data that exceeds a size of a wordline, and where the aggregate wordline includes residual data corresponding to the KV pair data, determine that the aggregate wordline exists in a first memory location of the memory device, read the KV pair data from a second memory location of the memory device based on the determining, where the first memory location and the second memory location are different memory types, and provide the residual data corresponding to the KV pair data from the first memory location and the KV pair data from the second memory location.

The controller is further configured to, when the aggregate wordline does not exist in the data storage device, read the KV pair data from a second memory location of the memory device. The first memory location is volatile memory and the second memory location is non-volatile memory. The first memory location stores one or more aggregated wordlines. The controller is further configured to determine that the residual data does not exist in the one or more aggregated wordlines stored in the first memory location. The controller is further configured to, when the aggregate wordline exists in the second memory location, read a wordline corresponding to the KV pair data from the second location, read the aggregate wordline corresponding to the KV pair data from the second location, and store the aggregate wordline in the first memory location. The controller is further configured to program one or more aggregate wordlines stored in the second memory location to a third memory location. The second memory location is single level cell (SLC) memory and the third memory location is either triple level cell (TLC) memory or quad-level cell (QLC) memory. The programming occurs as part of a data folding operation. The controller is further configured to skip programming the one or more aggregate wordlines stored in the second memory location to the third memory location until the programming occurs to a wordline that is closer to a center wordline than an edge wordline.

In another embodiment, a data storage device includes memory means and a controller coupled to the memory means. The controller includes an analysis and aggregation module. The analysis and aggregation module is configured to determine a length of a received key value (KV) pair data, where the length is greater than a size of a target wordline for programming of the received KV pair data, and determine a maximum number of values to store in an aggregate wordline, where the aggregate wordline stores residual data of one or more KV pair data, and where the residual data corresponds to data of the one or more KV pair data that exceeds the size of the target wordline. The controller is configured to aggregate the residual data of the one or more KV pair data to the aggregate wordline and program the aggregate wordline to the memory means.

The controller is further configured to retrieve the received KV pair data from the target wordline and the aggregate wordline. A portion of the received KV pair data is stored in the aggregate wordline as the residual data.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
   a memory device; and
   a controller coupled to the memory device, wherein the controller is further configured to:
      receive a key value (KV) pair data, wherein the KV pair data comprises a key and a value, and wherein the value has a value length;
      determine a size of the value length and a size of a target wordline of the memory device for programming of the KV pair data, wherein the size of the value length is greater than the size of the target wordline;
      determine a size of residual data, wherein the size of the residual data is the size of the value length minus the size of the target wordline; and
      store the residual data in a location separate from the target wordline and the KV pair data minus the residual data to the target wordline.

2. The data storage device of claim 1, wherein the location separate from the target wordline is volatile memory.

3. The data storage device of claim 1, wherein the controller is further configured to aggregate two or more residual data in the location separate from the target wordline.

4. The data storage device of claim 3, wherein the controller is further configured to program the aggregated two or more residual data to an aggregate wordline of the memory device when a size of the aggregated two or more residual data reaches or exceeds a size of the aggregate wordline.

5. The data storage device of claim 4, wherein the controller is further configured to, when the aggregated two or more residual data exceeds the size of the aggregate wordline, store a remaining residual of the aggregated two or more residual data in the location separate from the target wordline, and wherein the remaining residual is a portion of the aggregated two or more residual data that exceeds the size of the aggregate wordline.

6. The data storage device of claim 1, wherein the controller is further configured to program the stored residual data to an aggregate wordline of the memory device when a predetermined period of time has elapsed.

7. The data storage device of claim 1, wherein the controller is further configured to:
   receive another KV pair data, wherein the another KV pair data has a size greater than another target wordline;
   determine a size of an another value length associated with the another KV pair data and a size of the another target wordline of the memory device for programming of the KV pair data;
   determine a size of another residual data, wherein the size of the another residual data is the size of the another value length minus the size of the another target wordline; and
   store the another residual data in the location separate from the target wordline and the another KV pair data minus the another residual data in the another target wordline.

8. The data storage device of claim 7, wherein the controller is further configured to:
   receive a read command for the another KV pair data;
   read the another target wordline and the location separate from the target wordline, wherein both the another residual data and the residual data are read; and
   provide the another KV pair data minus the another residual data from the another target wordline and the another residual data from the location separate from the target wordline.

9. The data storage device of claim 8, wherein the controller is further configured to:
   receive another read command for the KV pair data;
   read the target wordline; and
   provide the KV pair data minus the residual data from the target wordline and the residual data previously read.

10. The data storage device of claim 1, wherein the controller is further configured to program the residual data stored in the location separate from the target wordline to an aggregate wordline of the memory device, and wherein the aggregate wordline is disposed closer to a center wordline than an edge wordline.

11. A data storage device, comprising:
    a memory device; and
    a controller coupled to the memory device, wherein the controller is configured to:
       receive a read command to read key value (KV) pair data, wherein the KV pair data includes a key and a value;
       determine if an aggregate wordline exists in the data storage device, wherein the aggregate wordline stores residual data of one or more KV pair data that exceeds a size of a wordline, and wherein the aggregate wordline includes residual data corresponding to the KV pair data;
       determine that the aggregate wordline exists in a first memory location of the memory device;
       read the KV pair data from a second memory location of the memory device based on the determining, wherein the first memory location and the second memory location are different memory types; and provide the residual data corresponding to the KV pair data from the first memory location and the KV pair data from the second memory location.

12. The data storage device of claim 11, wherein the controller is further configured to, when the aggregate wordline does not exist in the data storage device, read the KV pair data from a second memory location of the memory device.

13. The data storage device of claim 11, wherein the first memory location is volatile memory and the second memory location is non-volatile memory.

14. The data storage device of claim 11, wherein the first memory location stores one or more aggregated wordlines.

15. The data storage device of claim 14, wherein the controller is further configured to determine that the residual data does not exist in the one or more aggregated wordlines stored in the first memory location.

16. The data storage device of claim 15, wherein the controller is further configured to, when the aggregate wordline exists in the second memory location:
    read a wordline corresponding to the KV pair data from the second location;
    read the aggregate wordline corresponding to the KV pair data from the second location; and
    store the aggregate wordline in the first memory location.

17. The data storage device of claim 11, wherein the controller is further configured to program one or more aggregate wordlines stored in the second memory location to a third memory location, wherein the second memory location is single level cell (SLC) memory and the third memory location is either triple level cell (TLC) memory or quad-level cell (QLC) memory.

18. The data storage device of claim 17, wherein the programming occurs as part of a data folding operation, and wherein the controller is further configured to:
    skip programming the one or more aggregate wordlines stored in the second memory location to the third memory location until the programming occurs to a wordline that is closer to a center wordline than an edge wordline.

19. A data storage device, comprising:
    memory means; and
    a controller coupled to the memory means, wherein the controller comprises an analysis and aggregation module, wherein the analysis and aggregation module is configured to:
        determine a length of a received key value (KV) pair data, wherein the length is greater than a size of a target wordline for programming of the received KV pair data; and
        determine a maximum number of values to store in an aggregate wordline, wherein the aggregate wordline stores residual data of one or more KV pair data, and wherein the residual data corresponds to data of the one or more KV pair data that exceeds the size of the target wordline; and
    wherein the controller is configured to:
        aggregate the residual data of the one or more KV pair data to the aggregate wordline; and
        program the aggregate wordline to the memory means.

20. The data storage device of claim 19, wherein the controller is further configured to retrieve the received KV pair data from the target wordline and the aggregate wordline, and wherein a portion of the received KV pair data is stored in the aggregate wordline as the residual data.

* * * * *